United States Patent [19]

Ogino et al.

[11] Patent Number: 5,213,993
[45] Date of Patent: May 25, 1993

[54] METHOD OF MANUFACTURING SEMICONDUCTOR SUBSTRATE DIELECTRIC ISOLATING STRUCTURE

[75] Inventors: Masanobu Ogino, Yokosuka; Tsutomu Amai, Tokyo; Takanobu Kamakura, Yokosuka, all of Japan

[73] Assignee: Kabushiki Kaisha Tobisha, Kawasaki, Japan

[21] Appl. No.: 845,359

[22] Filed: Mar. 6, 1992

Related U.S. Application Data

[63] Continuation of Ser. No. 580,560, Sep. 11, 1990, abandoned.

[30] Foreign Application Priority Data

Sep. 13, 1989 [JP] Japan .................................. 1-237457
Jul. 3, 1990 [JP] Japan .................................. 2-175527

[51] Int. Cl.$^5$ ........................................ H01L 21/304
[52] U.S. Cl. ........................................ 437/62; 437/54; 437/63; 437/64; 148/DIG. 12; 148/DIG. 135;DIG. 9
[58] Field of Search ............. 148/DIG. 12, DIG. 135, 148/DIG. 9; 437/62, 61, 63, 64, 54

[56] References Cited

U.S. PATENT DOCUMENTS 3,997,381 12/1976 Wanlass .
4,179,324 12/1979 Kirkpatrick ..................... 156/230
4,738,935 4/1988 Shimbo et al. .
4,891,329 1/1990 Reisman et al. .
4,897,362 1/1990 Delgado et al. ..................... 437/26
5,013,681 5/1991 Godbey et al. ..................... 437/86

FOREIGN PATENT DOCUMENTS 0176747 4/1986 European Pat. Off. .
0209173 1/1987 European Pat. Off. .
0232935 8/1987 European Pat. Off. .
0328331 8/1989 European Pat. Off. .
62-181869 8/1987 Japan .
63-37652 2/1988 Japan .

OTHER PUBLICATIONS

Lasky, J. B., "Wafer bonding for silicon-on-insulator technologies", Jan. 1986, *Applied Physics Letters*, vol. 48, No. 1, pp. 78-80, American Institute of Physics, New York, U.S.

Nakagawa et al., "Two Types of 500V Double Gate Lateral N-ch Bipolar-Mode MOSFETs in Dielectrically Isolated P and N Silicon Islands" *International Electron Devices Meeting*, IEDM, Dec. 1988, San Francisco, Calif., U.S. pp. 817-820, IEEE.

M. Shimbo et al., "A Newly Developed Silicon to Silicon Direct Adhesion Method", Abs. No. 232, *169th Electrochem Soc. Mtg.*, p. 337 (1986)

J. Haisma et al., "Silicon-on-Insulator Wafer Bonding-Wafer Thinning Technological Evaluations", *Japanese J. Appl. Phys.*, vol. 28, No. 8, pp. 1426-1443 (Aug. 1989).

C. Harendt et al., "Silicon-on-Insulator Films Obtained by Etchback of Bonded Wafers", *J. Electrochem. Soc.*, vol. 136, No. 11, pp. 3547-3548 (Nov. 1989).

*Primary Examiner*—T. N. Quach
*Attorney, Agent, or Firm*—Finnegan, Henderson, Farabow, Garrett & Dunner

[57] ABSTRACT

A manufacturing method of this invention improves nonuniformity in film thickness of a circuit element formation region produced due to a poor flatness of a semiconductor substrate in the manufacture of a semiconductor substrate having a dielectric isolating structure. Mirror-polished surfaces of first and second semiconductor substrates are opposed and bonded to each other so as to sandwich a dielectric having a predetermined thickness, and the first semiconductor substrate is ground from the surface opposite to the adhesion surface to have a predetermined thickness with reference to the dielectric. An impurity is doped in the first semiconductor substrate to form a high-concentration impurity layer having an impurity concentration corresponding to a predetermined low-concentration impurity layer having a predetermined thickness thereon, thereby constituting a circuit element region. This invention is a method of manufacturing a semiconductor substrate, which improves film thickness precision of each circuit element formation layer for forming a circuit element.

13 Claims, 7 Drawing Sheets

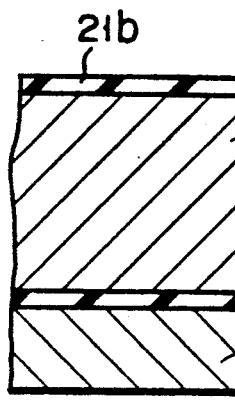
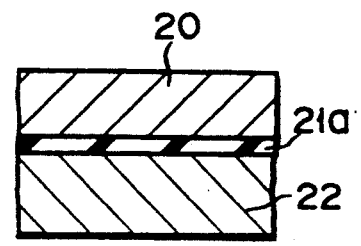
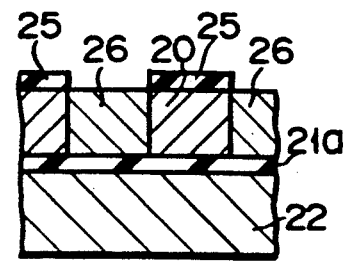
F I G. 5A     F I G. 5B     F I G. 5C
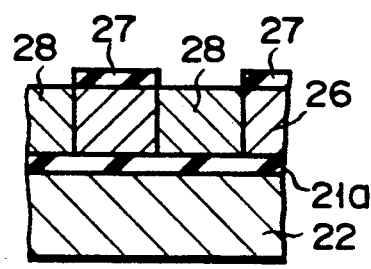
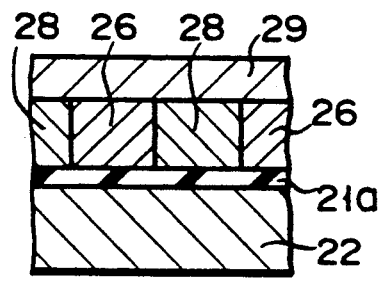
F I G. 5D     F I G. 5E
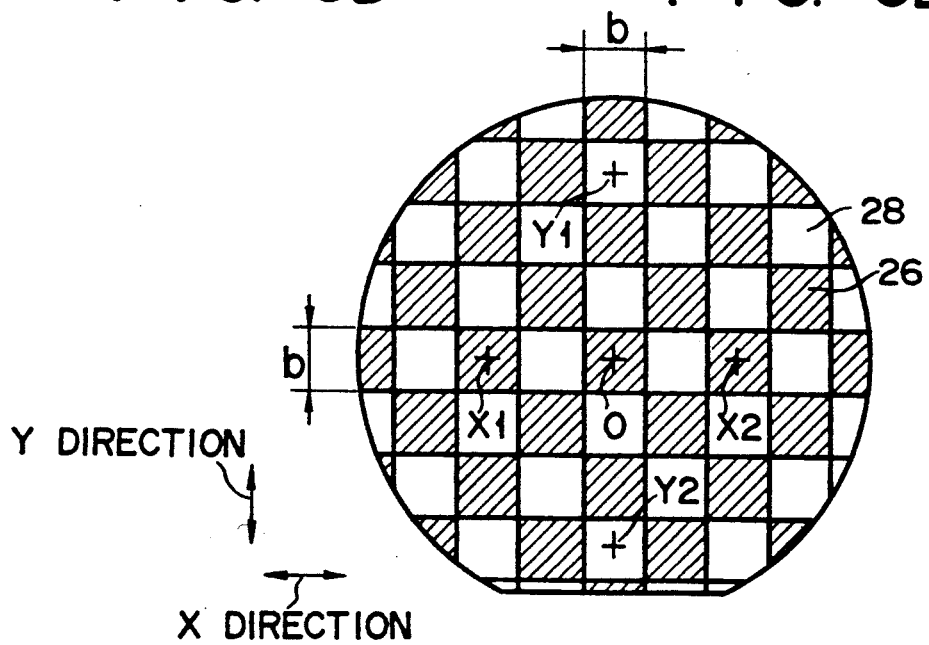
F I G. 6

METHOD OF MANUFACTURING SEMICONDUCTOR SUBSTRATE DIELECTRIC ISOLATING STRUCTURE

This application is a continuation, of application Ser. No. 07/580,560 filed Sep. 11, 1990, abandoned.

BACKGROUND OF THE INVENTION

1. Field of the Invention

The present invention relates to a semiconductor substrate manufacturing method and, more particularly, to a manufacturing method which improves film thickness precision of each layer of a semiconductor substrate having a dielectric isolating structure.

2. Description of the Related Art

In a semiconductor integrated circuit, various types of isolating structures are generally used to electrically isolate circuit elements so that the circuit elements do not interfere with each other.

An example of such an isolating structure is a dielectric isolating structure in which surfaces (the outer circumferential surfaces and the bottom surface) of a circuit element are perfectly surrounded by a predetermined dielectric so as to be isolated like an island (to be referred to as an isolated island hereinafter) from other circuit elements.

In this dielectric isolating structure, an insulating layer serving as a dielectric isolating layer of a bottom surface portion for electrically isolating a circuit element from other circuit elements is formed on a semiconductor substrate, and high- and low-concentration n-type silicon layers serving as circuit element regions are sequentially formed on the insulating layer. A trench-like groove is formed to perfectly surround the outer circumferential surfaces of the circuit element region and to extend from the outer circumferential surfaces of the circuit element region to the insulating film. An insulator is filled in the trench-like groove to form a trench isolation for isolating the circuit element from other circuit elements.

The bottom surface (bottom surface of an isolated island) of the circuit element region, therefore, is isolated by the insulating layer, and the trench-like groove in which an insulator is filled is formed around the circuit element region, thereby isolating the circuit element from other circuit elements.

In the manufacture of a circuit element region having the dielectric isolating structure described above, the insulating layer formed on the bottom of the insulation island or the conductive layer serving as a current path should have a precise thickness. This is because the characteristic and performance of the circuit element are determined by the thickness of the insulating layer or that of the conductive layer. In order to form an insulation layer or a conductive layer, having a sufficiently precise thickness, several conditions, must be satisfied.

First, the film thickness of the low-concentration n-type silicon layer must be uniform. An error of this uniformity preferably falls within the range of ±10%. That is, if a predetermined thickness is 1.5 μm, for example, an error is preferably ±0.15 μm or less.

Second, a sheet resistance of the high-concentration n-type silicon layer must be uniform. An error of this sheet resistance preferably falls within the range of ±15%. For example, an error is preferably ±3 ΩΠ or less with respect to a predetermined value of 20 Ω/Π.

Third, since the side surfaces of the isolated island are perfectly surrounded by an insulator, this structure can be manufactured more easily when the groove for receiving the insulator is shallow. Therefore, the total film thickness of the high- and low-concentration n-type silicon layers is preferably small in order to form the dielectric isolating film in the lateral direction. That is, the film thickness is preferably 5 μm or less.

Conventional manufacturing steps of a general dielectric isolating structure will be described below. A first conventional manufacturing method is shown in FIGS. 11A to 11C.

In an $n^+$-type impurity diffusing step shown in FIG. 11A, a high-concentration $n^+$-type impurity is diffused in a low-concentration n-type silicon substrate 1 serving as a first silicon substrate, thereby forming a high-concentration n-type silicon layer 2. In an adhering step shown in FIG. 11B, the two surfaces of the first silicon substrate are oxidized to form silicon oxide ($SiO_2$) films 3. In addition, a second silicon substrate 4 is bonded to the $SiO_2$ film 3 at the silicon layer 2 side. In a polishing step shown in FIG. 11C, the resultant structure is polished from the side of the low-concentration n-type silicon substrate 1 of the bonded first and second silicon substrates to have a predetermined thickness.

A second conventional manufacturing method is shown in FIGS. 12A to 12C.

In an adhering step shown in FIG. 12A, the two surfaces of a high-concentration n-type silicon substrate 5 serving as a first silicon substrate are oxidized to form silicon oxide films 6. A second silicon substrate 7 is bonded to the silicon oxide film 6. In a polishing step shown in FIG. 12B, the resultant structure is polished from the side of the high-concentration n-type silicon substrate 5 of the bonded first and second silicon substrates to have a predetermined thickness with reference to the bonded surface. In an epitaxial growth step shown in FIG. 12C, a low-concentration n-type silicon film 8 is formed by epitaxial growth on the high-concentration n-type silicon substrate 5 of the silicon substrate having the predetermined thickness.

A third conventional manufacturing method is shown in FIGS. 13A to 13E.

In an epitaxial growth step shown in FIG. 13A, a low-concentration n-type silicon film 10 is formed by epitaxial growth on a high-concentration n-type silicon substrate 9 serving as a first silicon substrate. In an adhering step shown in FIG. 13B, the two surfaces of a substrate constituted by the silicon substrates 9 and 10 are oxidized to form silicon oxide films 11. A second silicon substrate 12 is bonded to the silicon oxide film 11 at the silicon film 10 side. Thereafter, the bonded silicon substrates are annealed in a nitrogen/oxygen gas atmosphere. The resultant structure is dipped in a fluoric acid solution to remove the silicon oxide film 11 at the high-concentration n-type silicon substrate 9 side.

In a selective etching step shown in FIG. 13C, an etching solution having a high etching selectivity with respect to high-concentration n-type silicon is used to selectively etch and remove only the high-concentration n-type silicon substrate 9. In an $n^+$-type impurity diffusing step shown in FIG. 13D, a high-concentration $n^+$-type impurity is diffused in the low-concentration n-type silicon film 10 of the etched silicon substrate. In an epitaxial growth step shown in FIG. 13E, a low-concentration n-type silicon film 13 is epitaxially grown on the n-type silicon film 10 now having a high concentration. Note that this structure can be similarly manufactured by using a p-type silicon substrate instead of the n-type silicon substrate 9.

The following problems are posed, however, in the manufacture of a circuit element region using a dielectric isolating structure by any of the above conventional manufacturing methods.

That is, even a silicon substrate (e.g., a 125 mm silicon wafer) considered to have a satisfactory flatness normally has thickness uniformity of about 1.0 μm. In the polishing step of the above first conventional manufacturing method shown in FIG. 11C, therefore, if thin films are formed on the surfaces of a silicon substrate and the resultant structure is polished with reference to the rear surface (opposite surface) of the silicon substrate, it is difficult to polish the structure such that an error in uniformity of the film thickness of the low-concentration n-type silicon layer 1 falls within the range of ±10% of the film thickness, i.e., ±0.15 μm or less throughout the entire surface of the silicon substrate.

In the second conventional manufacturing method, a predetermined film thickness can be obtained by removing a silicon substrate (a 125 mm silicon wafer) by polishing and performing epitaxial growth. Therefore, the total film thickness of the high- and low-concentration n-type silicon layers 5 and 8 can be set to be about 3.5 μm.

In the polishing step shown in FIG. 12B, since the flatness of the silicon substrate represents thickness uniformity of about 1.0 μm as described above, the uniformity in film thickness of the polished n-type silicon layer 5 is similarly degraded. As a result, the sheet resistance uniformity is lost to produce a difference of 24% to 34% according to sample data. In general, when an impurity concentration of a high-concentration n-type silicon film is about $5 \times 10^{18}$ atm/cm$^3$ or more, a film thickness cannot be measured because infrared rays for film thickness measurement cannot be transmitted. That is, it is sometimes difficult to polish the high-concentration n-type silicon layer 5 to have a predetermined thickness.

In the third conventional manufacturing method, the uniformity in film thickness and the sheet resistance of the high- and low-concentration n-type silicon layers can satisfy the above important conditions. When however, the low-concentration n-type silicon film 10 is epitaxially grown on the high-concentration n-type silicon layer 9 in the epitaxial growth step shown in FIG. 13A, particles of a reaction product or the like often bond to the surface of the silicon layer 9 to form undulations on the surface. If the surface is oxidized in this state to form the silicon oxide film 11 and the silicon substrate 12 having a mirror-like adhesion surface is bonded to the silicon oxide film 11, cavities may be formed between the adhesion surfaces.

In addition, since the above epitaxial growth step requiring higher cost than those of the other manufacturing steps is repeatedly performed twice, the manufacturing cost is rather increased, and the manufacturing steps are complicated. For these reasons, the third convention manufacturing method is not preferable as a mass-production method.

As another isolating method, in an isolating structure using an isolation diffusion layer formed by p-type impurity diffusion, a junction capacitance is present in a formed transistor to prevent a high operation speed of a circuit element. In addition, since an isolated island is isolated from other circuit elements by the isolation diffusion layer, the width of an isolating layer becomes larger than that obtained when an insulator is used, thereby limiting the degrees of micro-patterning and integration.

SUMMARY OF THE INVENTION

It is an object of the present invention to provide a method of manufacturing a semiconductor substrate, which can eliminate influences of flatness of a semiconductor substrate and film thickness precision of each layer produced by manufacturing steps on characteristics of a circuit element to obtain uniformity in film thickness and resistance of each layer forming the circuit element, thereby improving characteristics and performance of the circuit element.

According to the present invention, at least one surface of each of first and second semiconductor substrates having a predetermined conductivity type is mirror-polished. A dielectric film is formed on one of the mirror-polished surfaces, the mirror-polished surfaces of the first and second semiconductors are opposed and bonded to sandwich the dielectric film, and annealing is performed. The other surface of one of the first and second semiconductor substrates bonded as described above is polished to have a predetermined thickness with reference to the dielectric film side, and a high-concentration impurity is doped in the polished surface. A low-concentration impurity semiconductor layer is formed on the high-concentration impurity doped surface.

According to the method of manufacturing a semiconductor substrate having the dielectric isolating structure of the present invention, therefore, the uniformity in film thickness of each circuit element forming layer can be obtained.

In a conventional method, characteristics and performance of a circuit element are determined by flatness of a semiconductor substrate and film thickness precision of each circuit element forming layer in a polishing step. When a circuit element is formed on the semiconductor substrate manufactured by the method of the present invention, however, a circuit element region where the film thickness precision has no influence on characteristics and performance of a circuit element can be formed.

As described above, according to the present invention, a semiconductor integrated circuit having a perfect dielectric isolating structure which is conventionally difficult to manufacture and put into practical use can be realized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 5A to 5E are sectional views showing a method of manufacturing a semiconductor substrate having a dielectric isolating structure according to the second embodiment of the present invention;

FIG. 6 is a view showing measurement points on the semiconductor substrate shown in FIGS. 5A to 5E;

DETAILED DESCRIPTION OF THE PREFERRED EMBODIMENTS

FIGS. 1A to 1D are sectional views showing a method of manufacturing a semiconductor substrate having a dielectric isolating structure according to the first embodiment of the present invention.

Figure 1A:
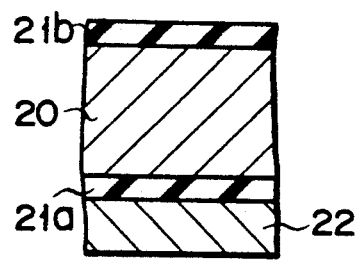
FIGS. 1A to 1D are sectional views showing a method of manufacturing a semiconductor substrate having a dielectric isolating structure according to the first embodiment of the present invention.

That is, in an adhering step shown in FIG. 1A, 1-$\mu$m thick $SiO_2$ layers (dielectric layers) 21a, 21b are formed on two surfaces of a first n-type silicon substrate 20 having a diameter of 125 mm, a thickness of 625 $\mu$m, a crystal orientation of (100), and a specific resistance of 1 to 2 $\Omega$·cm. In this case, at least one surface of the substrate 20 is mirror polished.

At least one surface of a second n-type silicon substrate 22 (if a silicon wafer is used, a crystal orientation, a specific resistance, a shape, and the like are not limited) having a diameter of 125 mm, a thickness of 625 $\mu$m, a crystal orientation of (100), and a specific resistance of 5 to 10 $\Omega$·cm is mirror-polished. The first and second silicon substrates 20 and 22 are bonded in the air at room temperature so that the mirror-polished surfaces oppose each other. Thereafter, the resultant structure is annealed in a gas atmosphere in which $N_2:O_2=4:1$ (volume ratio) at 1,100° C. for two hours, thereby adhering the first and second silicon substrates.

Figure 1B:
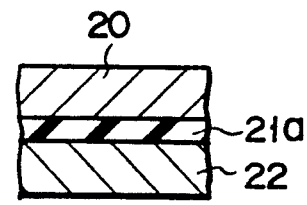

In a polishing step shown in FIG. 1B, the first silicon substrate 20 is ground to have a thickness of about 15 $\mu$m by using a surface grinder. This ground surface is mirror-polished by mechano-chemical polishing so that an average thickness at the central portion of the silicon substrate is 2.5 $\mu$m.

Figure 1C:
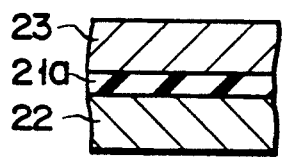

In an n+-type impurity diffusing step shown in FIG. 1C, impurity diffusion is performed for the first silicon substrate by a conventional diffusion method using a solid diffusion source of antimony oxide ($Sb_2O_3$). That is, n+-type impurity diffusion is performed in an $N_2$ gas atmosphere at 1,253° C. for 60 minutes (the solid diffusion source is held at 950° C.), thereby forming a high-concentration n-type silicon layer 23 having an average sheet resistance of 20 $\Omega/\square$.

Figure 1D:
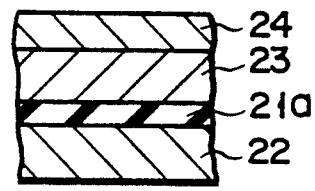

In an epitaxial growth step shown in FIG. 1D, a low-concentration n-type silicon layer 24 is epitaxially grown on the high-concentration n-type silicon layer 23. That is, the layer 24 having a thickness of 1.5 $\mu$m and a specific resistance of 0.5 to 0.7 $\Omega$·m is epitaxially grown by using $SiHCl_3$ gas at a predetermined temperature.

Fifty samples of the dielectric-isolated substrate were manufactured in accordance with the above-described process.

Figure 2:
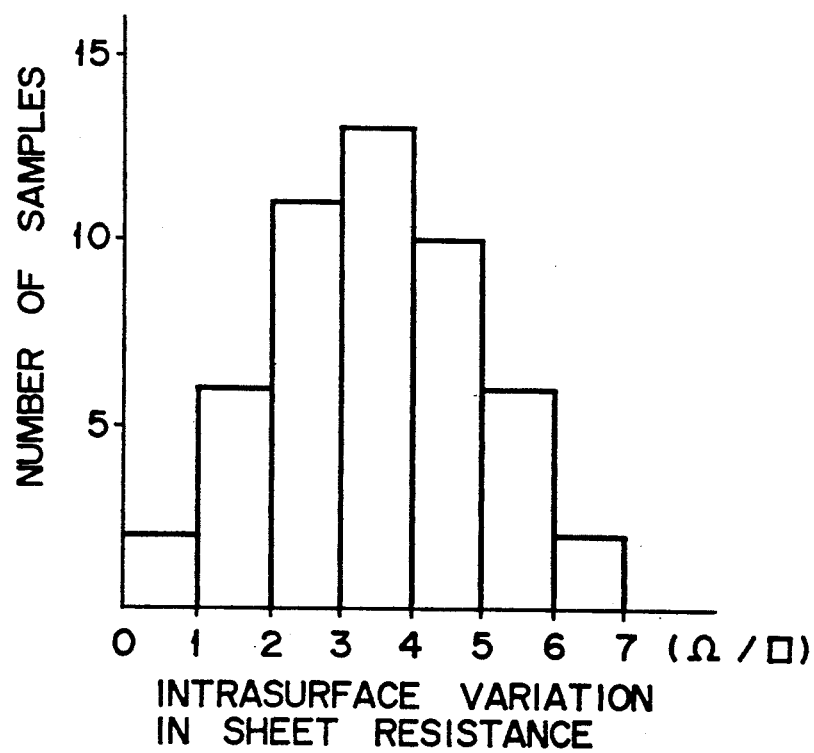
FIG. 2 is a histogram showing an intrasurface distribution of a sheet resistance of the semiconductor substrate manufactured by the manufacturing steps shown in FIGS. 1A to 1D.
Figure 3:
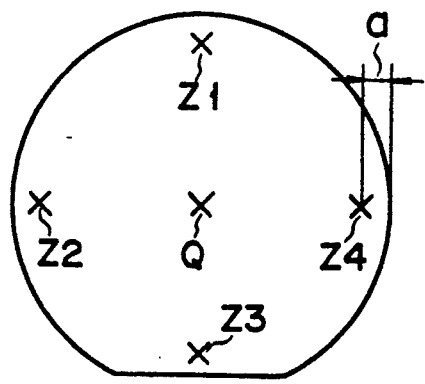
FIG. 3 is a view showing measurement points on the semiconductor substrate shown in FIG. 2.

FIG. 2 shows tendency in a sheet resistance intrasurface distribution of the high-concentration n-type silicon layers 23 of the above samples. FIG. 3 is a view showing five measurement points (Q and $Z_1$ to $Z_4$) indicated by mark x and located inside the outer circumference of the silicon substrate by a distance a (5 mm).

That is, in FIG. 2, the abscissa indicates a difference between maximum and minimum values at the measurement points x shown in FIG. 3 as a variation or error in sheet resistance, and the ordinate indicates the number of samples. FIG. 2 reveals that an average value of the sheet resistance variation intrasurface distribution is 3.47 $\Omega/\square(\pm 8.7\%)$, i.e., an error is $\pm 1.735$ $\Omega/\square$ with respect to a predetermined value of 20 $\Omega/\square$. Therefore, the uniformity of $\pm 15\%$ described above is satisfactorily ensured.

Figure 4:
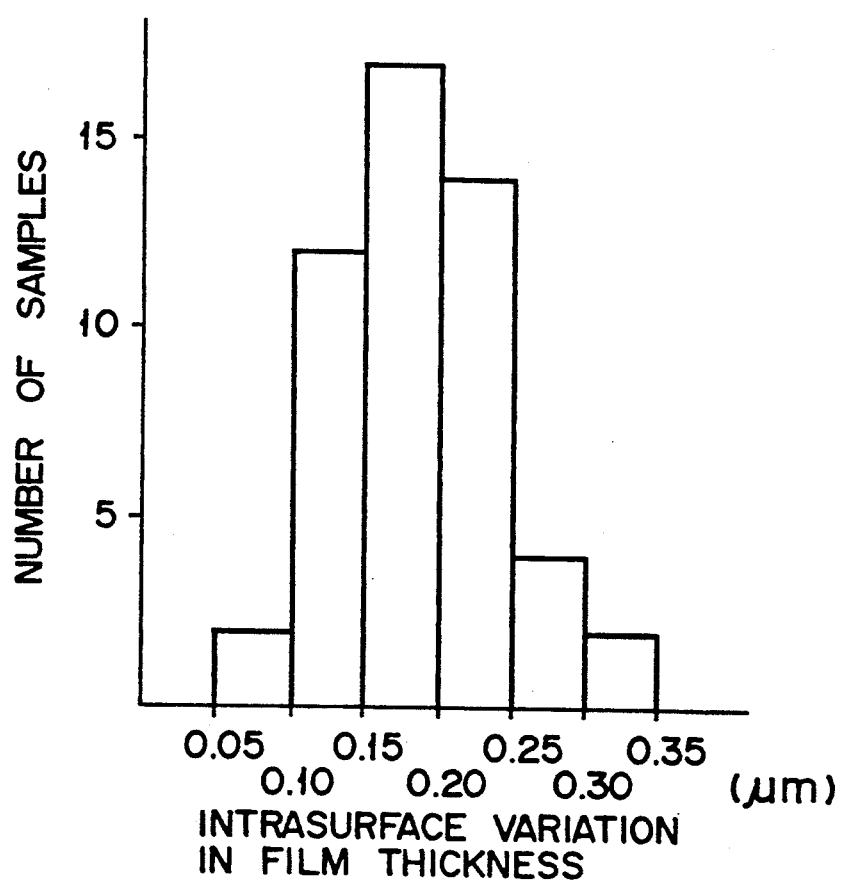
FIG. 4 is a histogram showing a film thickness distribution of an epitaxial film of the semiconductor substrate manufactured by the manufacturing steps shown in FIGS. 1A to 1D.

FIG. 4 shows tendency in a film thickness distribution of epitaxially grown low-concentration n-type silicon layers 24 of samples formed similarly to the above samples. In FIG. 4, five measurement points on a silicon substrate are located at the same positions as those of the measurement points of a sheet resistance in FIG. 3.

In FIG. 4, the abscissa indicates the non-uniformity of the epitaxially grown film in terms of thickness, which is a difference between the thicknesses of the thickness and thinnest portions of the film, and the ordinate indicates the number of samples. FIG. 4 indicates that an average value of the film thickness distribution of the n-type epitaxially grown film is 0.19 $\mu$m ($\pm 6.3\%$), i.e., an error is $\pm 0.095$ with respect to a predetermined value of 1.5 $\mu$m. Therefore, the uniformity of $\pm 10\%$ or less with respect to a predetermined film thickness described above is satisfactorily ensured.

In addition, the uniformities in sheet resistance and film thickness distribution between the silicon substrates are substantially the same values as those described above, i.e., are practically satisfactory values.

Furthermore, since the total film thickness of a film thickness of 2.5 $\mu$m of the high-concentration n-type silicon layer 23 and a film thickness of 1.5 $\mu$m of the low-concentration n-type silicon layer 24 is 4 $\mu$m, formation of an isolated island can be easily performed.

FIGS. 5A to 5E are sectional views showing a method of manufacturing a semiconductor substrate having a dielectric isolating structure according to the second embodiment of the present invention. Referring to FIGS. 5A to 5E, the same reference numerals as in the first embodiment denote the same parts and a detailed description thereof will be omitted.

First, an adhering step shown in FIG. 5A and a polishing step shown in FIG. 5B are performed similarly to the adhering step (FIG. 1A) and the polishing step (FIG. 1B) of the first embodiment.

In an n+-type impurity diffusing step shown in FIG. 5C, an oxide film 25 is formed on the upper surface of a first silicon substrate 20 and selectively removed by photolithography, thereby exposing the surface of a region in which an n+-type impurity is to be diffused. The resultant silicon substrate is put in an $N_2$ gas atmosphere, and n+-type impurity diffusion is performed by using antimony trioxide ($Sb_2O_3$) as a diffusion source at 1,250° C. for 60 minutes (note that the solid diffusion source is held at 950° C.), thereby forming a high-concentration n-type silicon layer 26 having a sheet resistance of 20 Ω/□.

In a p+-type impurity selective diffusing step shown in FIG. 5D, an oxide film 27 is formed on the upper surface of the first silicon substrate subjected to the n+-type impurity diffusion and selectively removed by photolithography, thereby exposing the surface of a region in which a p+-type impurity is to be diffused.

Thereafter, p+-type impurity diffusion is performed by a conventional diffusion method using BSG (Boron Silicate Glass) to form a high-concentration p-type silicon layer 28 having a sheet resistance of 20 Ω/□. The oxide film 27 is removed after the impurity diffusion.

In an epitaxial growth step shown in FIG. 5E, $SiHCl_3$ gas is used to epitaxially grow a low-concentration n-type silicon layer 29 having a thickness of about 1.5 μm on the high-concentration p-type silicon layer 28 and the high-concentration n-type silicon layer 26 at a predetermined temperature.

The manufacturing steps shown in FIGS. 5A to 5E were performed as described above to form 50 dielectric-isolated silicon substrates (samples A) shown in FIG. 6 in which squares having a side b (=15 mm) of the high-concentration n-type silicon layers 26 formed by the n+-type impurity diffusion and the high-concentration p-type silicon layers 28 formed by the p+-type impurity diffusion were arranged in a matrix manner.

In addition, the manufacturing steps shown in FIGS. 5A to 5D except for the epitaxial growth step (FIG. 5E) were performed to form 50 dielectric-isolated silicon substrates (samples B).

Figure 7:
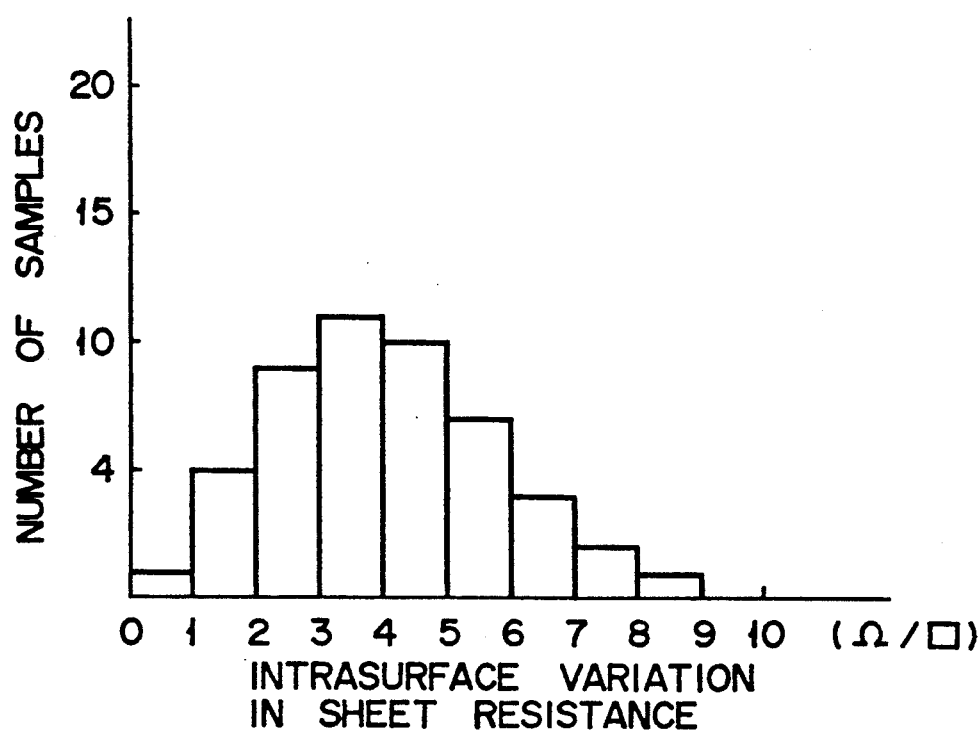
FIG. 7 is a histogram showing a sheet resistance distribution of an epitaxial film of the semiconductor substrate manufactured by the manufacturing steps shown in FIGS. 5A to 5D.

FIG. 7 shows tendency of a sheet resistance intrasurface distribution of the high-concentration n-type silicon layers 26 and the high-concentration p-type silicon layers 28 of the samples B. The sheet resistance is measured at five points 0, X1, X2, Y1, and Y2 on the p+-type conductive layer formed on each wafer, as is illustrated in FIG. 6. The difference between the highest and lowest sheet resistances measured of these five points is defined as a variation or error of sheet resistance. In FIG. 7, the errors of sheet resistance, measured of all wafers, are plotted on the abscissa, whereas the number of samples is represented on the ordinate. FIG. 7 reveals that an average sheet resistance variation of p+ doping area on a water is 3.54 Ω/□ (±8.85%), i.e., an error is ±1.77 Ω/□ with respect to a predetermined resistance of 20 Ω/□. Therefore, the uniformity of ±15% or less described above is satisfactorily ensured.

The sheet-resistance distribution of the high-impurity N type silicon layer 26 of sample B was measured in the same way. The results were similar to those described above; that is, ±1.73 Ω/□, ±8.65%.

Figure 8:
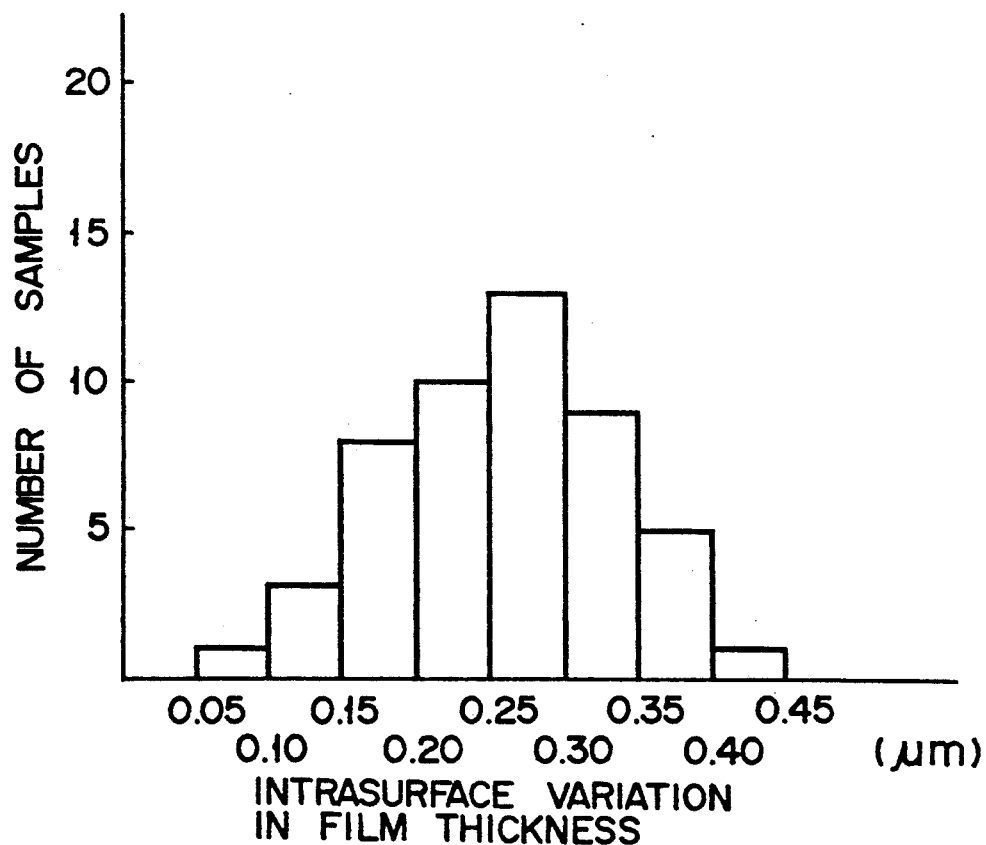
FIG. 8 is a histogram showing a film thickness distribution of the epitaxial film of the semiconductor substrate manufactured by the manufacturing steps shown in FIGS. 5A to 5E.

FIG. 8 shows tendency of a film thickness distribution of the films (the low-concentration n-type silicon layers 27 shown in FIG. 5E). In this case, the five points at which sheet resistance is measured of the silicon substrate are identical to those shown in FIG. 6. In addition, a difference between maximum and minimum values is defined as the value of the above epitaxially grown film thickness. In FIG. 8, the abscissa indicates the film thickness, and the ordinate indicates the number of samples.

From FIG. 8, it is seen that an average film thickness of the film thickness distribution of the n-type epitaxially grown films is 0.23 μm (±7.7%), i.e., an error is ±0.115 with respect to a predetermined film thickness of 1.5 μm. Therefore, the uniformity of ±10% or less of a predetermined film thickness described above is satisfactorily ensured. In addition, since uniformities in sheet resistance and film thickness distribution between the silicon substrates are substantially the same as those described above, these substrates can be satisfactorily put into practical use.

Furthermore, since the total film thickness of a film thickness of 2.5 μm of the high-concentration n- and p-type silicon layers 24 and 26 and a film thickness of 1.5 μm of the low-concentration n-type silicon layer 27 is 4 μm, an isolated island can be easily formed.

Figure 9:
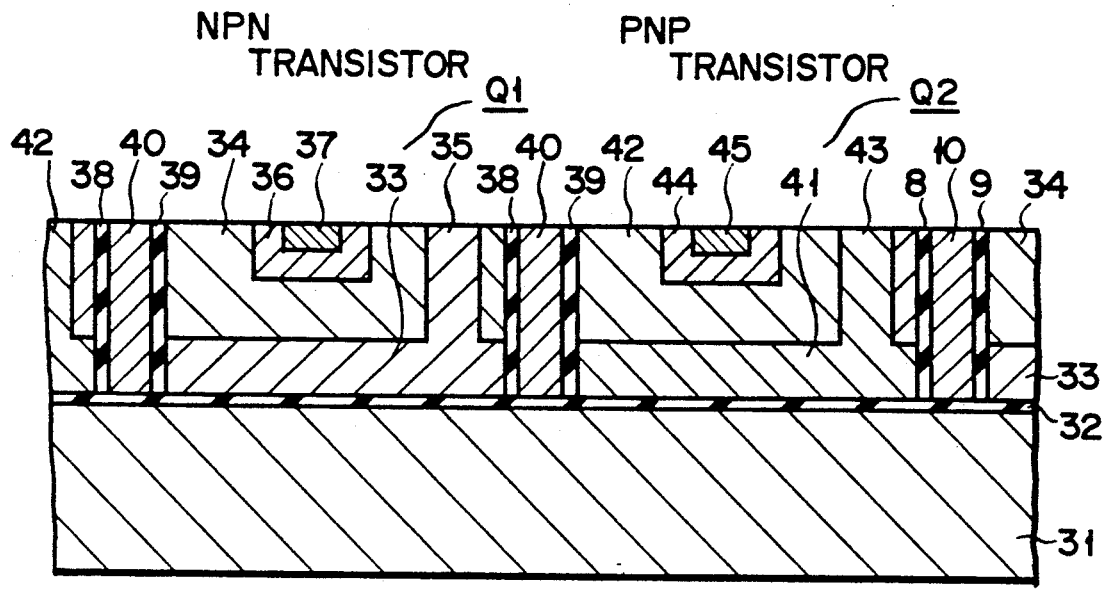
FIG. 9 is a sectional view showing a practical semiconductor device using the dielectric isolating structure of the present invention.

FIG. 9 is a sectional view showing a practical arrangement of a semiconductor device (constituted by a PNP transistor Q1 and an NPN transistor Q2) having the above dielectric isolating structure.

In this structure, an insulating layer ($SiO_2$) 32 is formed on the surface of a semiconductor substrate 31, and a high-concentration n-type silicon layer 33 is formed on portions of the surface of the layer 32. A low-concentration n-type silicon layer 34 and an n-type impurity diffusion layer 35 serving as a collector are formed on the surface of the layer 33.

A p-type impurity diffusion layer 36 serving as base is formed on the layer 34, and an n-type impurity diffusion layer 37 serving as an emitter is formed in the diffusion layer 36, thereby constituting an NPN transistor Q1. A groove is formed along the four side surfaces of the NPN transistor Q1, and insulating films ($SiO_2$) 38 and 39 are formed on the two side surfaces of the groove. A polycrystalline silicon layer 40 is formed in the groove.

A high-concentration p-type silicon layer 41 is formed on a portion of the insulating layer 32 via the dielectric isolating wall. A low-concentration p-type silicon layer 42 and a p-type impurity diffusion layer 43 serving as a collector are formed on the surface of the layer 41. An n-type impurity diffusion layer 44 serving as a base is formed in the layer 42, and a p-type impurity diffusion layer 45 serving as an emitter is formed in the diffusion layer 44, thereby constituting a PNP transistor Q2.

In this semiconductor device, therefore, the bottom surfaces of the PNP and NPN transistors are isolated by the insulating layer. Further the trench-like groove is formed around each transistor, and an insulator is formed in this groove, thus isolating the two transistors from each other and from other circuit elements.

Figure 10:
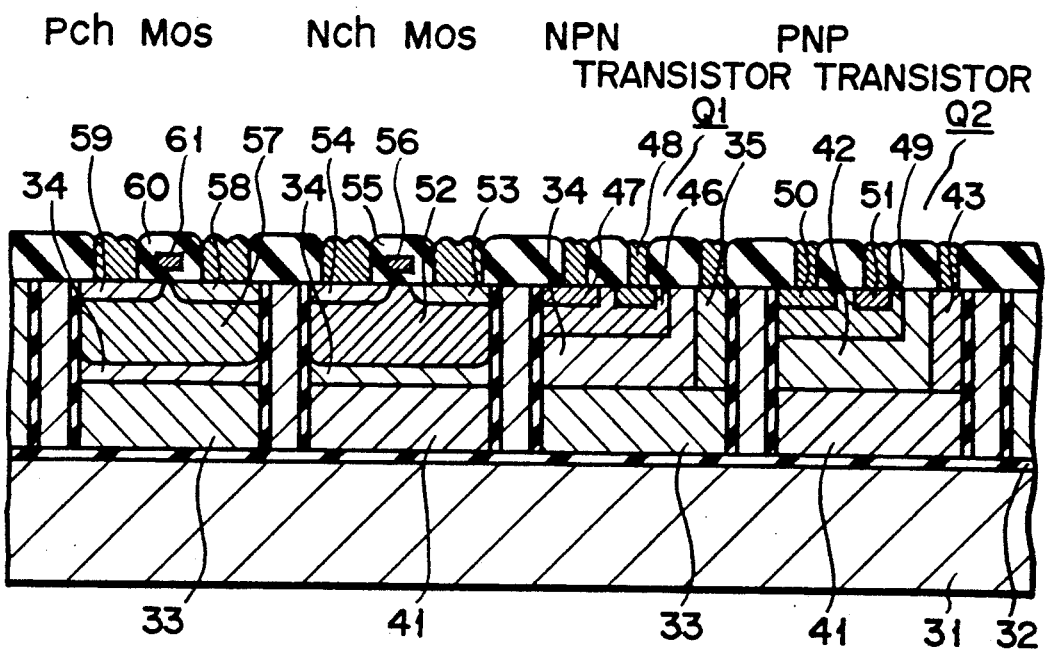
FIG. 10 is a sectional view showing another practical semiconductor device using the dielectric isolating structure of the present invention.
Figure 11A:
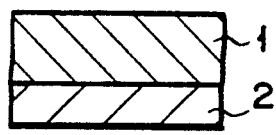
FIGS. 11A to 13E are sectional views showing manufacturing steps of conventional semiconductor substrates.
Figure 11B:
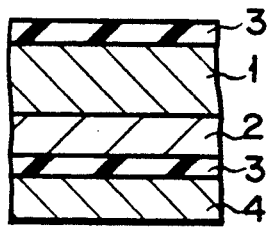
Figure 11C:
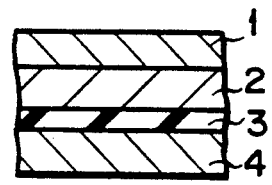
Figure 12A:
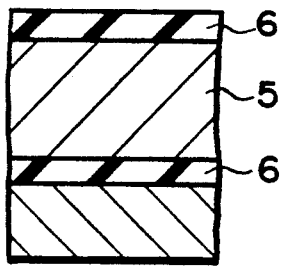
Figure 12B:
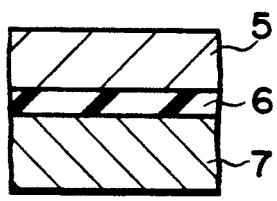
Figure 12C:
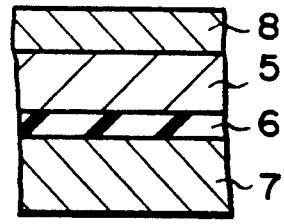
Figure 13A:
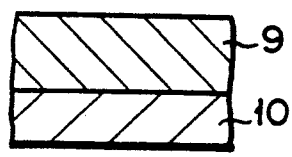
Figure 13B:
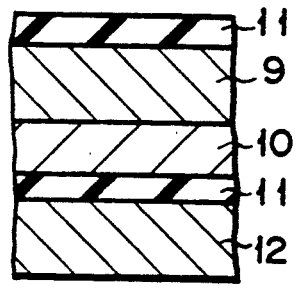
Figure 13C:
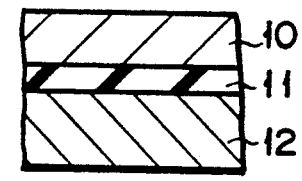
Figure 13D:
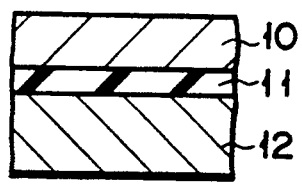
Figure 13E:
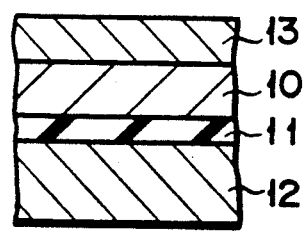

FIG. 10 is a sectional view showing another practical arrangement of a semiconductor device (constituted by a Bi-CMOS having a PNP transistor Q1 and an NPN transistor Q2) having the above dielectric isolating structure. Referring to FIG. 10, the same reference numerals as in FIG. 9 denote the same parts and a detailed described thereof will be omitted.

In an NPN transistor Q1 portion cf this arrangement, a low-concentration p-type silicon layer 46 is formed in a low-concentration n-type silicon layer 34, and a high-concentration p-type silicon layer 47 serving as a base and a high-concentration n-type silicon layer 48 serving as an emitter are formed in the layer 46.

In a PNP transistor Q2 portion, a low-concentration n-type silicon layer 49 is formed in a low-concentration p-type silicon layer 42, and a high-concentration n-type silicon layer 50 serving as a base and a high-concentration p-type silicon layer 51 serving as an emitter are formed in the layer 49.

In an Nch MOS portion, a low-concentration silicon layer 34 is formed on the surface of a high-concentration p-type silicon layer 41, and a p-type well portion 52 is formed on the surface of the layer 34. A high-concentration n-type silicon layer 53 serving as a drain and a high-concentration n-type silicon layer 54 serving as a source are formed to be separated from each other in the p-type well portion 52, and a gate 56 is formed on the surface across the layers 53 and 54 via an SiO$_2$ layer 55.

In a Pch MOS portion, a low-concentration n-type silicon layer 34 is formed on the surface of a high-concentration p-type silicon layer 33, and an n-type well portion 57 is formed on the layer 34. A high-concentration p-type silicon layer 58 serving as a drain and a high-concentration p-type silicon layer 59 serving as a source are formed to be separated from each other in the n-type well portion 57, and a gate 61 is formed on the surface across the layers 58 and 59 via an SiO$_2$ layer 60.

A metal (Al) electrode is formed on the upper surface of each of the collector, the base, the emitter, the drain, and the source of the PNP and NPN transistors and the Pch and Nch MOS portions, and a polycrystalline silicon circuit element isolating layer is formed between the electrodes. In addition, the bottom surfaces of the PNP and NPN transistors and the Pch and Nch MOS portions are isolated by the insulating layer. Further the trench-like groove is formed around each transistor, and an insulator is formed in this groove, thus isolate the transistors from each other and from other circuit elements.

In addition, as compared with a structure in which circuit elements are isolated from each other by using an isolation diffusion layer, in the semiconductor integrated circuit formed on the semiconductor substrate having the dielectric isolating structure manufactured by the method of the present invention, an operation speed of each circuit element is easily increased since no junction capacitance is present between the silicon substrate and the buried layer formed by high-concentration impurity diffusion. Furthermore, the semiconductor integrated circuit of this embodiment can be isolated by a thinner layer than that used in a conventional structure because an insulating layer is used. Therefore, a degree of integration of circuit elements can be easily increased.

As has been described above, when a circuit element is formed on a semiconductor substrate having the dielectric isolating structure manufactured by the method of the present invention, a circuit element region in which film thickness precision upon manufacture has no influence on characteristics and performance of the circuit element ca be formed.

The method of manufacturing a semiconductor substrate having the dielectric isolating structure of the present invention, therefore, can achieve satisfactory uniformity in both the film thickness and resistance of a circuit element formation layer, thereby realizing a semiconductor integrated circuit having a good dielectric isolating structure which is difficult to manufacture and put into practical use by conventional methods.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

What is claimed is:

1. A method of manufacturing a semiconductor substrate having a dielectric isolating structure, comprising the steps of:

mirror-polishing a surface of each of first and second semiconductor substrates of a predetermined conductivity type;

forming a dielectric film on one of said mirror-polished surfaces obtained in said polishing step;

opposing said mirror-polished surfaces through said dielectric film to join said first and second semiconductor substrates therebetween;

reducing a one of said first and second semiconductor substrates to a predetermined thickness using mechanical means;

doping a high-concentration impurity on the one of the semiconductor substrates reduced in the reducing step, the doping step being performed at a time when the one of the semiconductor substrates has the predetermined thickness; and forming a low-concentration impurity semiconductor layer on the one of the semiconductor substrates doped in said impurity doping step.

2. A method according to claim 1, wherein in said impurity doping step, a high-concentration n-type impurity and a high-concentration p-type impurity are doped in respective predetermined regions of the one of the first and second semiconductor substrates reduced in the reducing step.

3. A method according to claim 1, wherein said first and second semiconductor substrates include n-type silicons having different impurity concentrations.

4. A method according to claim 1, wherein said first and second semiconductor substrates include p-type silicons having a different impurity concentrations.

5. A method according to claim 1, wherein said dielectric film includes silicon dioxide.

6. A method according to claim 1, wherein said dielectric film includes silicon nitride.

7. A method according to claim 1, wherein said dielectric film consists of tantalum oxide.

8. A method according to claim 1, wherein the reducing step includes the substep of grinding using a surface grinder.

9. A method according to claim 1, wherein the reducing step includes the substeps of grinding; and subsequently, mechano-chemical polishing.

10. A method of manufacturing a semiconductor substrate having a dielectric isolating structure, comprising the steps of:

mirror-polishing a surface of each of first and second semiconductor substrates of a predetermined conductivity type;

forming a dielectric film on one of said mirror-polished surfaces obtained in said polishing step;

opposing said mirror-polished surfaces through said dielectric film to join said first and second semiconductor substrates therebetween;

reducing a one of said first and second semiconductor substrates to a predetermined thickness using mechanical means;

selectively doping a first impurity in a first region of the one of the semiconductor substrates reduced in the reducing step, at a time when the one of the semiconductor substrates has the predetermined thickness to form a first high-concentration impurity region;

selectively doping a second impurity in a second region of the one of the semiconductor substrates reduced in the reducing step, at a time when the one of the semiconductor substrates has the predetermined thickness, the second region being laterally offset from the first region to form a second high-concentration impurity region; and forming a low-concentration impurity semiconductor layer on surfaces of said first and second high-concentration impurity regions, respectively.

11. A method according to claim 9, wherein said first and second high-concentration impurity regions are arranged in a matrix manner.

12. A method according to claim 10, wherein the reducing step includes the substep of grinding using a surface grinder.

13. A method according to claim 10, wherein the reducing step includes the substeps of grinding; and subsequently, mechano-chemical polishing.

* * * * *